United States Patent [19]

Koch, II et al.

[11] Patent Number: 5,692,026
[45] Date of Patent: Nov. 25, 1997

[54] APPARATUS FOR REDUCING CAPACITIVE LOADING OF CLOCK AND SHIFT SIGNALS BY SHIFTING REGISTER-BASED DEVICES

[75] Inventors: Kenneth Koch, II; William J. Queen, both of Fort Collins, Colo.

[73] Assignee: Hewlett-Packard Company, Palo Alto, Calif.

[21] Appl. No.: 657,732

[22] Filed: May 31, 1996

[51] Int. Cl.$^6$ .................................................. G11C 19/00
[52] U.S. Cl. ........................... 377/73; 377/81; 327/218
[58] Field of Search ........................ 377/73, 81; 327/218

[56] References Cited

U.S. PATENT DOCUMENTS

| | | | |
|---|---|---|---|
| 5,138,641 | 8/1992 | Mehta | 377/81 |
| 5,559,844 | 9/1996 | Lee | 377/116 |

*Primary Examiner*—Margaret Rose Wambach
*Attorney, Agent, or Firm*—Kevin M. Hart

[57] ABSTRACT

A shift register, circular pointer or ring counter presents a reduced capacitive load on the clock and shift signals used to control it. The device is constructed using one or more enhanced data cells. Each data cell has a data input, a data output, a clock input and a shift input. The data output of each cell is coupled to the data input of an adjacent cell. At least one pass-AND gate is provided for each cell. The pass-AND gate has a switching input and a switched input. The switching input operates to toggle the input capacitance of the switched input between a larger and a smaller value. The logical OR of the data input and data output of each cell is used to drive the switching input of the associated pass-AND gates for that cell. The switched input of the pass-AND gate is adapted to be coupled to the clock (or shift) signal, and the output of the pass-AND gate is coupled to the clock (or shift) input of the data cell. When two such pass-AND gates are provided for each cell, one may be used for the clock signal, and the other for the shift signal. In this manner, only those cells of the shift register, circular pointer or ring counter whose outputs are asserted, or will become asserted during the next shift operation, will present a larger capacitance to the clock and shift signals. All of the other cells will present a smaller capacitance to the clock and shift signals.

5 Claims, 7 Drawing Sheets

TIME PERIOD A

TIME PERIOD B

TIME PERIOD C

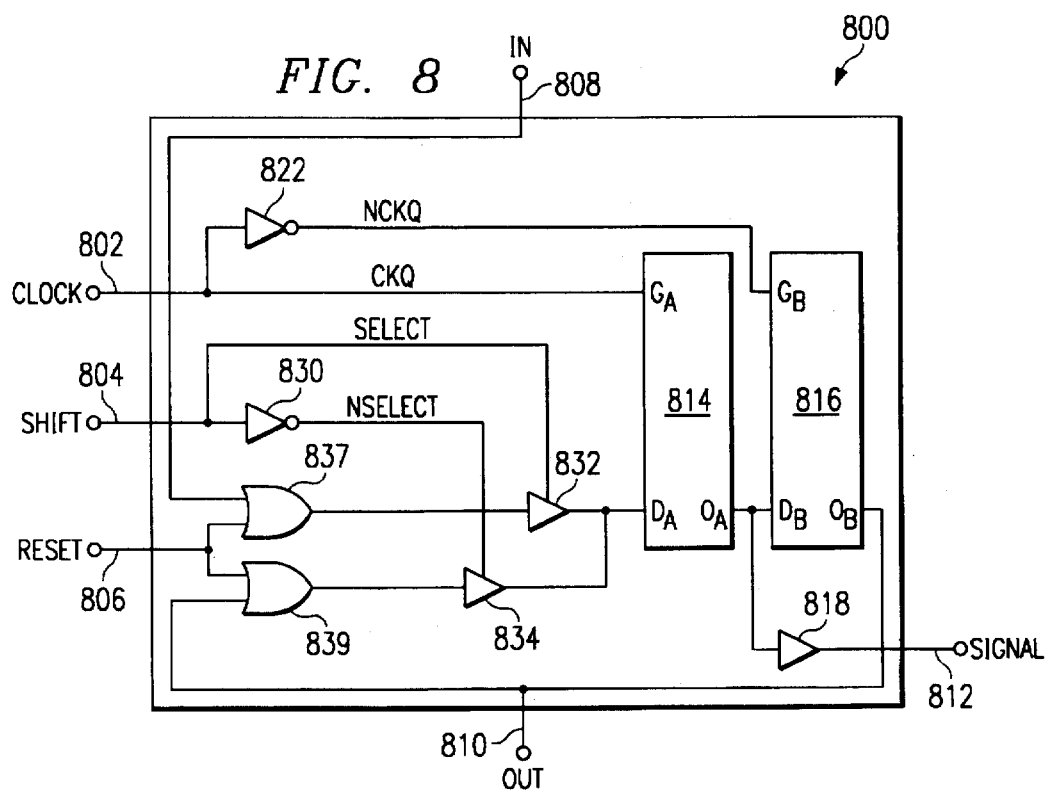
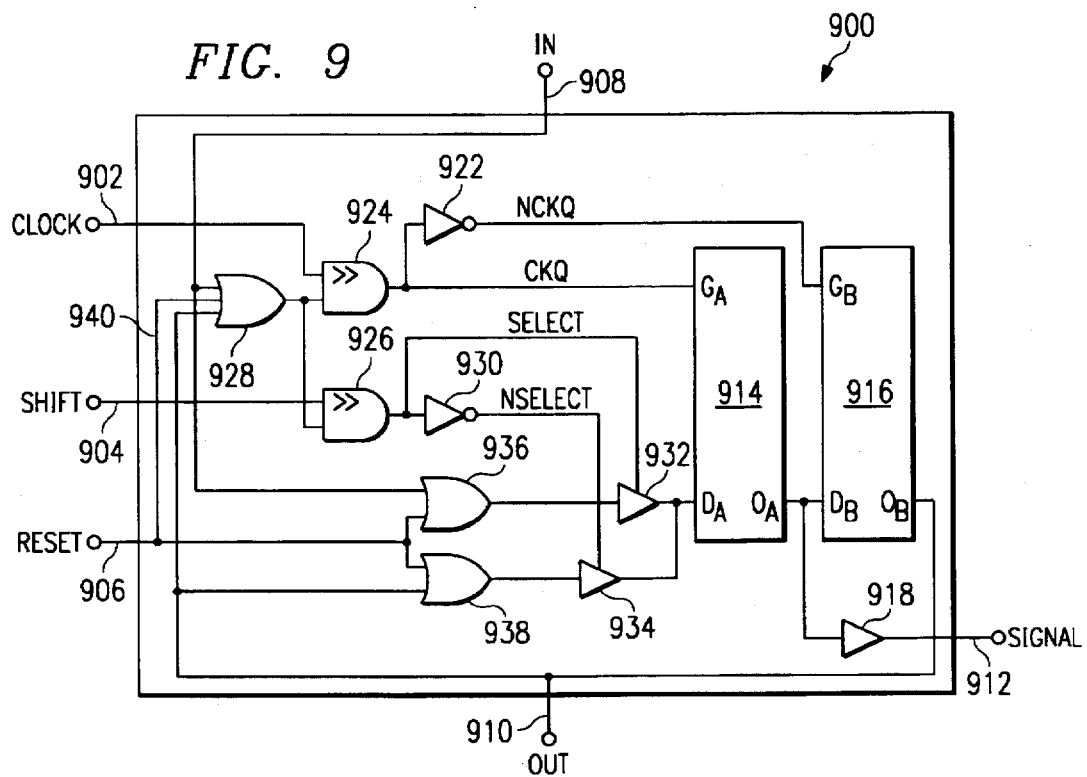

APPARATUS FOR REDUCING CAPACITIVE LOADING OF CLOCK AND SHIFT SIGNALS BY SHIFTING REGISTER-BASED DEVICES

FIELD OF THE INVENTION

This invention relates to the field of digital logic design, and more particularly to a shift register that presents a reduced capacitive load on the clock and shift signals used to control it.

BACKGROUND

VLSI circuits are being designed to run at increasingly fast speeds in order to meet performance demands. As operating speeds increase, however, capacitive loading of the signals within such circuits becomes increasingly problematic. Capacitive loading causes a variety of ill effects including signal distortion and increased propagation delays. In addition, signals with large capacitive loads require commensurately large circuitry to drive them, which is undesirable given the general objective to achieve increasingly smaller circuit implementations.

In particular, shift registers and shift register-based devices are known to exhibit capacitive loading problems. This is because such devices generally comprise a number of data cells, each data cell having a clock and a shift input. Moreover, the clock and shift inputs of the data cells are all connected in parallel. Thus, every data cell in such a configuration contributes an incremental capacitive load to the clock and shift signals, resulting in a high total capacitive load on these signals.

One prior art method for addressing the capacitive loading problem has been to reduce the size of the transistors used to implement the logic that is driven by the clock and shift signals. Unfortunately, this method causes the logic of the shift register to be less capable of driving its own loads quickly. Another prior art method for addressing the capacitive loading problem has been to duplicate the clock and shift signals themselves, so that each signal drives fewer loads. Unfortunately, this method doubles the number of wires used in the circuit and does not reduce power consumption.

It is therefore an object of the present invention to provide a shift register that presents a reduced capacitive load on the shift and clock signals used to drive it.

It is a further object of the present invention to provide such a shift register without reducing the size of the transistors used to implement it.

It is a still further object of the present invention to provide such a shift register without duplicating the clock and shift signals necessary to drive it.

SUMMARY OF THE INVENTION

In a preferred embodiment, the invention includes an enhanced data cell that may be used to construct a shift register, circular pointer or ring counter. It is contemplated that each data cell in the shift register, circular pointer or ring counter will have a clock input, a shift input, a data input and a data output. Generally, the data input of each cell will be coupled to the data output of an adjacent cell. Although the enhanced data cell of the invention may be used to construct a shift register, circular pointer or ring counter having any number of bits, the total capacitive load placed on the clock and shift signals will be significantly smaller that the sum of the individual capacitances of the clock and shift inputs for all of the data cells.

A pass-AND gate is provided, having a switched input and a switching input. The switching input operates to toggle the input capacitance of the switched input from a larger to a smaller value. The data input and the data output signals of the enhanced data cell are coupled to the inputs of an OR gate. The output of the OR gate is used to drive the switching input of the pass-AND gate. The switched input of the pass-AND gate is adapted to be coupled to the clock (or shift) signal. The output of the pass-AND gate is coupled to the clock (or shift) input of the data cell.

In another preferred embodiment, two such pass-AND gates are provided, each having its switching input driven by the logical OR of the data cell's data input and data output signals. One of the pass-AND gates is adapted to have its switched input coupled to the clock signal, and its output is coupled to the data cell's clock input. The other pass-AND gate is adapted to have its switched input coupled to the shift signal, and its output is coupled to the data cell's shift input. In this manner, only those cells of the shift register, circular pointer or ring counter whose outputs are asserted, and those cells whose outputs will become asserted on the next shift operation, will present a larger capacitive load on their clock and shift inputs. All other cells will present a smaller capacitive load on their clock and shift inputs.

BRIEF DESCRIPTION OF THE DRAWINGS

The present invention is described herein with reference to the accompanying drawings, like reference numbers being used therein to indicate identical or functionally similar elements.

FIG. 8 is a schematic diagram illustrating a second preferred embodiment of data cell 0 for the shift register-based circular pointer of FIG. 3.

FIG. 9 is a schematic diagram illustrating a third preferred embodiment of data cell 0 for the shift register-based circular pointer of FIG. 3.

DETAILED DESCRIPTION OF THE PREFERRED EMBODIMENTS

Figure 1:
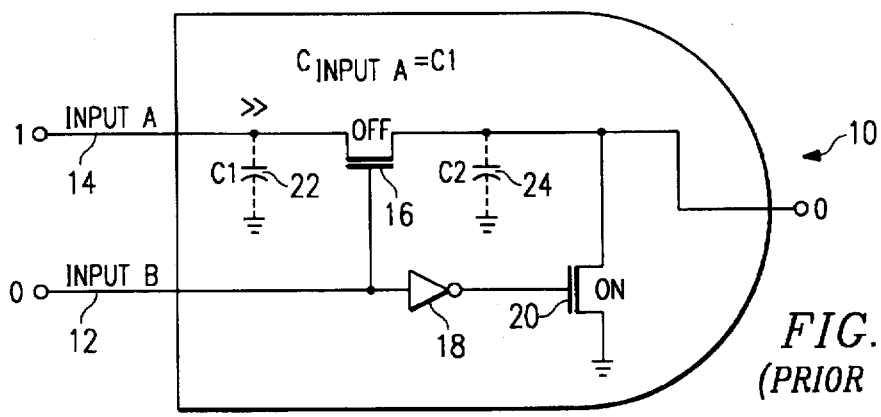
FIG. 1–2 are schematic diagrams illustrating a prior art pass-AND gate in various stages of operation.
Figure 2:
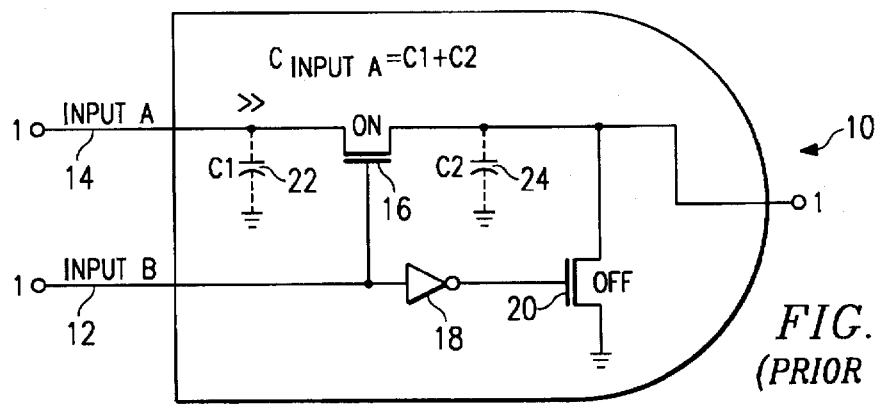

By way of background, it is known that a pass-AND gate 10 may be constructed as shown in FIG. 1–2. Such a pass-AND gate 10 includes a switching input 12 and a switched input 14. Switching input 12 is connected to the gate of a transistor 20 through an inverter 18. Switching input 12 is also connected to the gate of a transistor 16. The output of pass-AND gate 10 is taken from the drain/source of transistor 16, which is also connected to the source/drain of transistor 20. The result of this configuration is that, while capacitance C1 is always presented to input A, capacitance C2 is only visible to input A when input B is asserted. Thus, as shown in FIG. 1, when input B=0, the capacitance of input A is C1 only. When input B=1, however, as shown in FIG. 2, the capacitance of input A is C1+C2. Typically, C1 is much smaller than C2.

Figure 3:
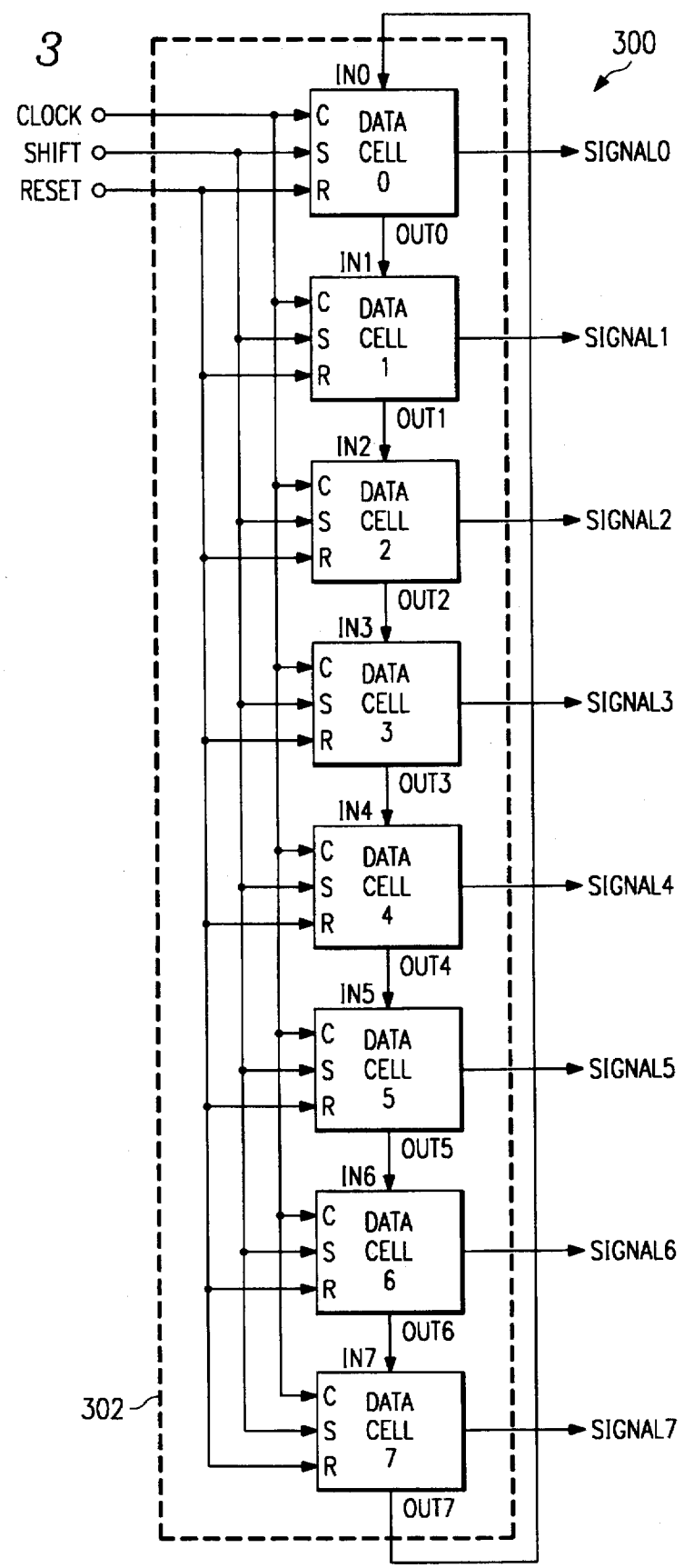
FIG. 3 is a schematic diagram illustrating a shift register-based circular pointer constructed according to a preferred embodiment of the invention.

FIG. 3 is a schematic diagram illustrating a shift register-based circular pointer 300 constructed according to a preferred embodiment of the invention. Circular pointer 300 is constructed using a shift register 302. Shift register 302 comprises data cells 0–7. Each of data cells 0–7 has a clock input C, a shift input S, a reset input R, a data input, shown at IN0–7, and a data output, shown at OUT0–7. All of the clock, shift and reset inputs are connected in parallel to a CLOCK, SHIFT and RESET signal, respectively. Data output OUT7 is connected to data input IN0. Finally, each of data cells 0–7 has a signal output SIGNAL0–7. When RESET is asserted, preferably data cell 0 resets to 1, but all other data cells reset to 0. Whenever the SHIFT signal is asserted, the single asserted bit in data cell 0 will be shifted to the next data cell with every assertion of the CLOCK signal. Because OUT7 is connected to IN0, the single asserted bit will thus travel in a continuous circle as long as SHIFT is asserted and CLOCKs are received.

Figure 4:
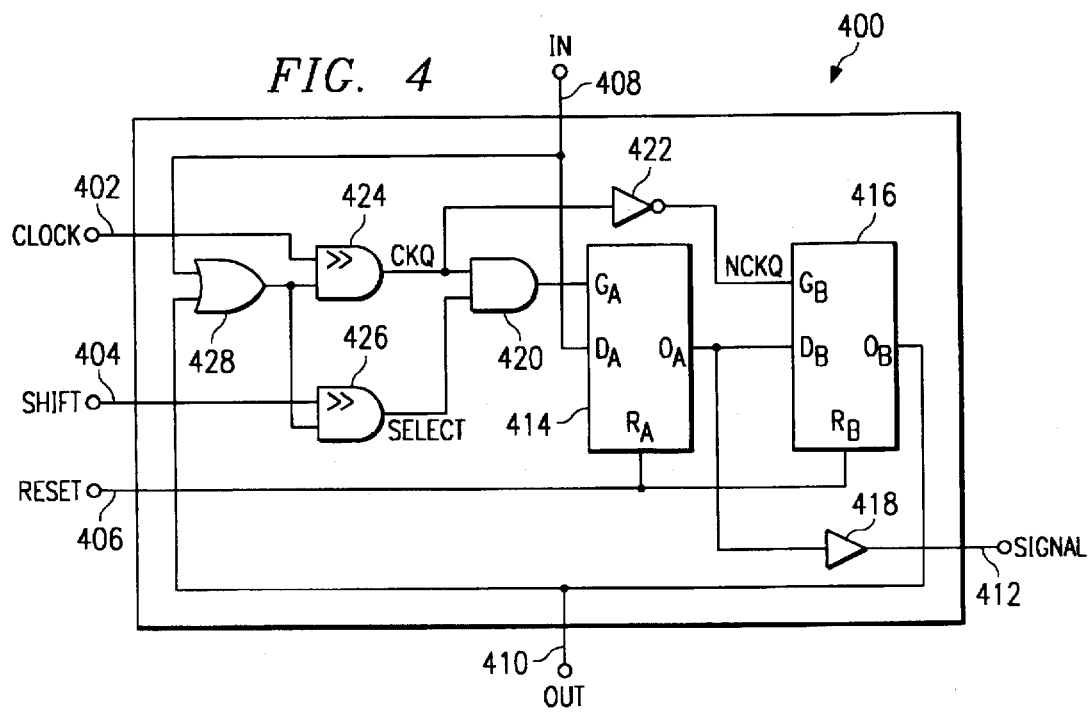
FIG. 4 is a schematic diagram illustrating a first preferred embodiment of data cells 0–7 for the shift register-based circular pointer of FIG. 3.

FIG. 4 is a schematic diagram illustrating a preferred implementation for data cells 0–7 in shift register 302. Data cell 400 has a clock input 402, a shift input 404 a reset input 406, a data input 408, a data output 410 and a signal output 412. Included within data cell 400 are two latches 414 and 416. Latch 414 has a gate input GA, a data input DA, a data output OA and an asynchronous reset input RA. Latch 416 has a gate input GB, a data input DB, a data output OB and an asynchronous reset input RB. Data output 410 is driven by latch output OB, while signal output 412 is driven by latch output OA via buffer 418. Latch data input DB is connected to latch data output OA, while latch data input DA is connected to data input 408. Gate input GA is driven by the output of AND gate 420. The two inputs of AND gate 420 are provided by the outputs of pass-AND gates 424 and 426, respectively. The output of pass-AND gate 424 drives gate input GB via inverter 422. The switched input of pass-AND gate 424 is connected to clock input 402, while the switched input of pass-AND gate 426 is connected to shift input 404. The switching input of both pass-AND gates 424 and 426 is connected to the output of OR gate 428. One input of OR gate 428 is connected to input 408, and the other input of OR gate 428 is connected to latch output OB.

Figure 5A:
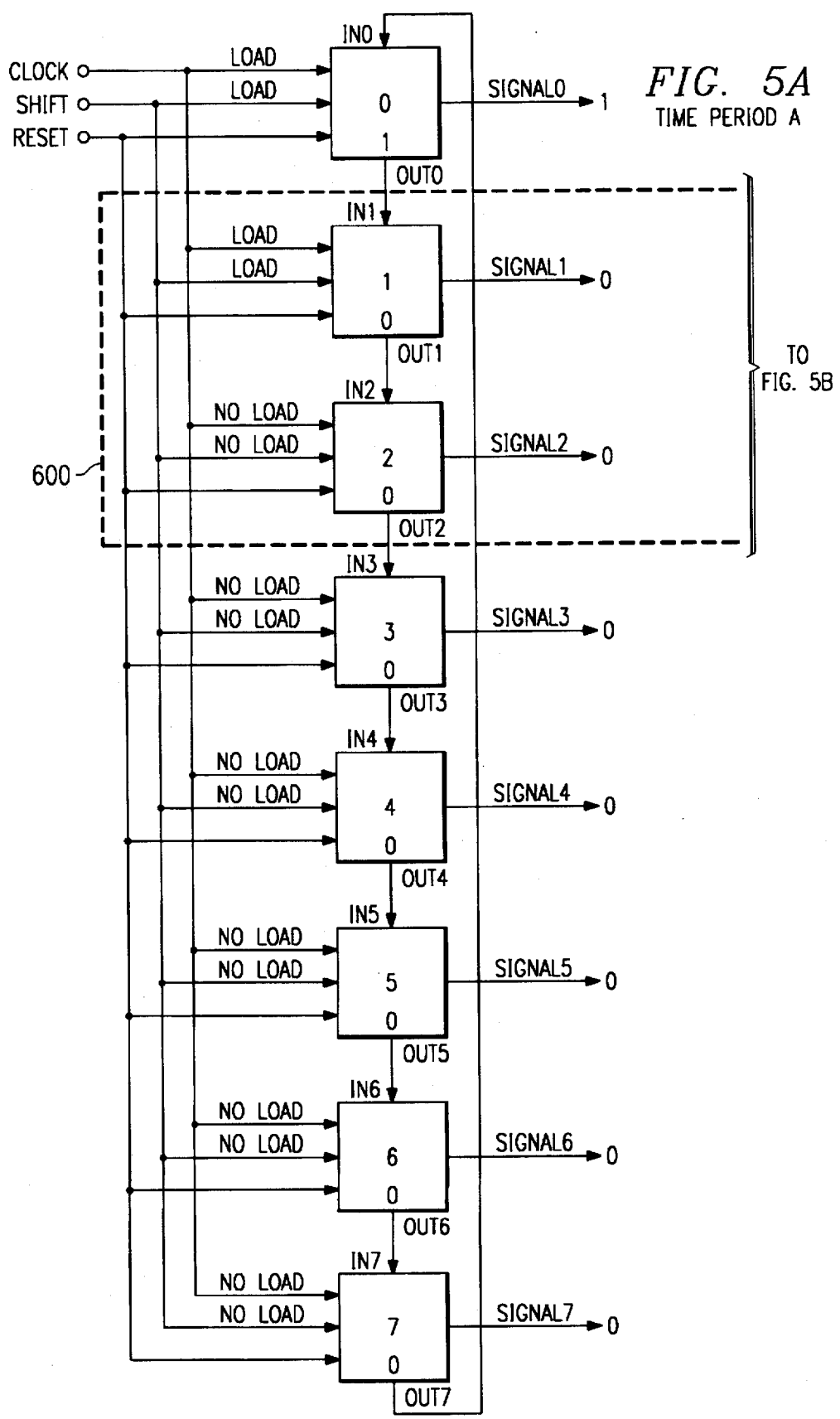
FIG. 5A–5C are schematic diagrams illustrating the shift register-based circular pointer of FIG. 3 in various stages of operation.
Figure 5B:
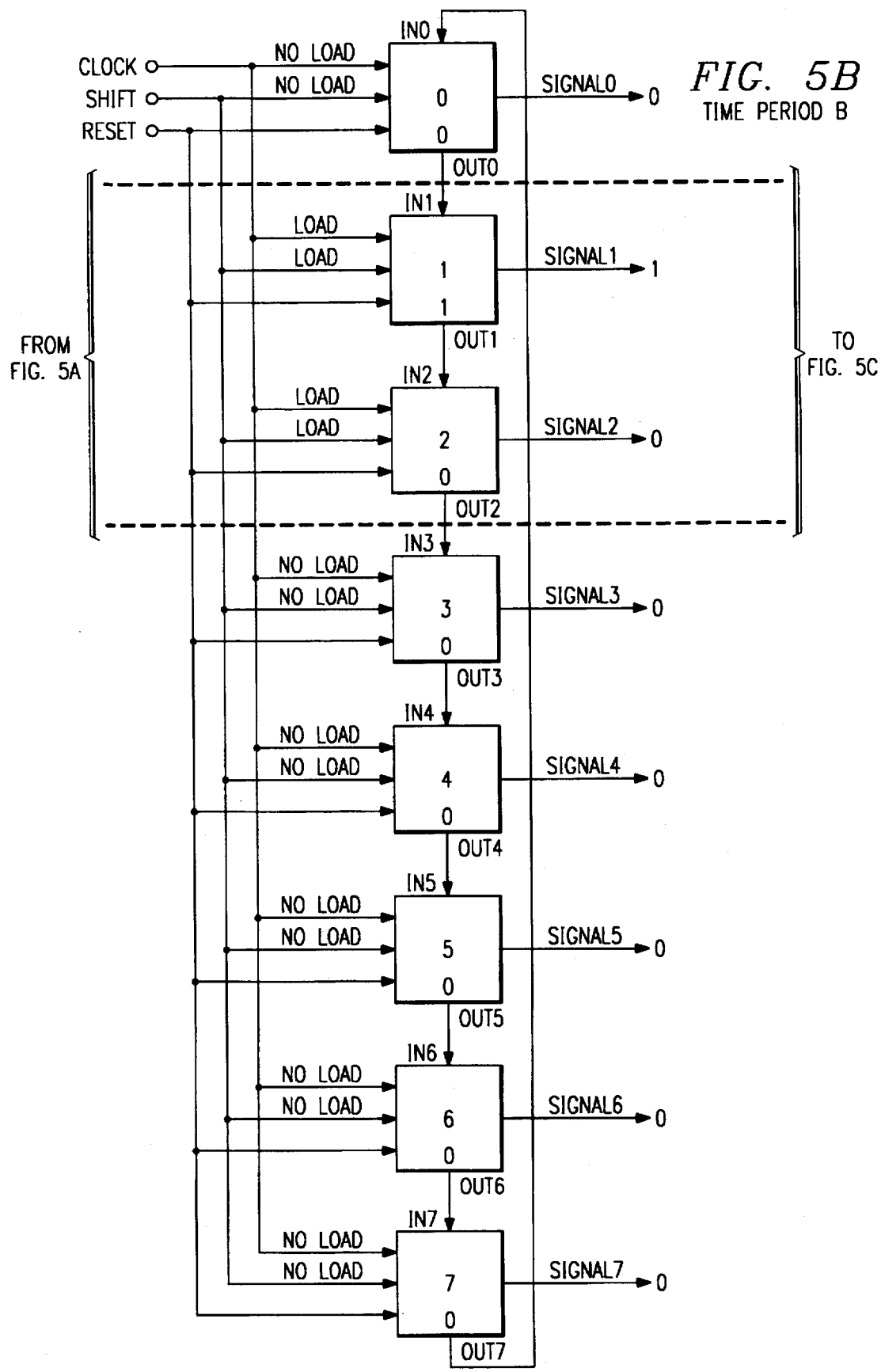
Figure 5C:
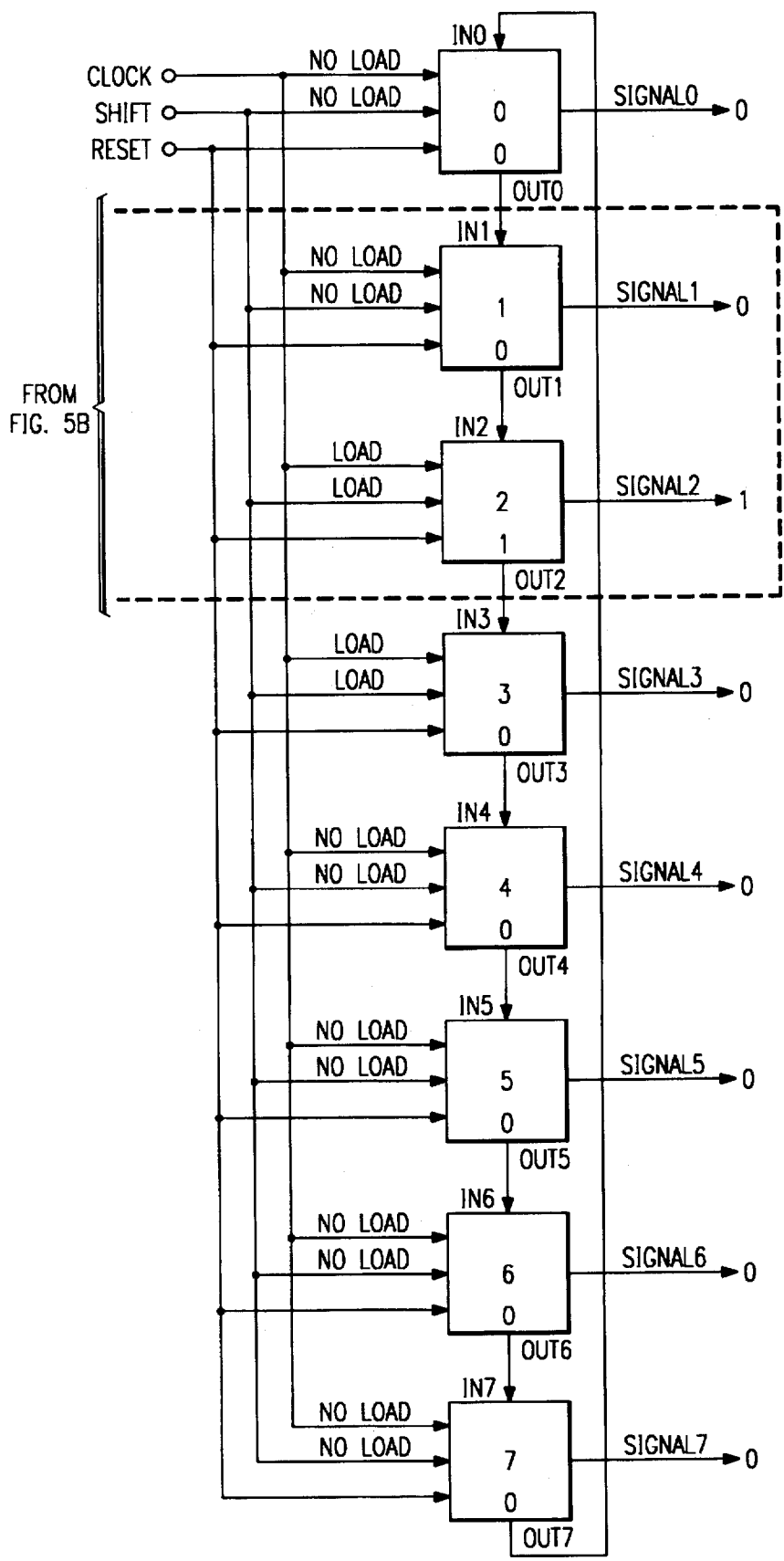
Figure 6:
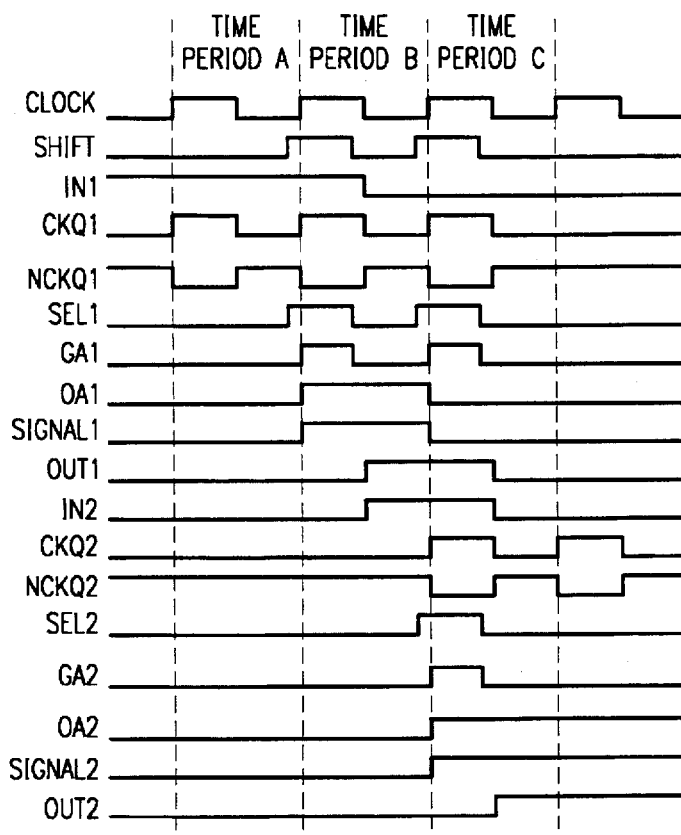
FIG. 6 is a timing diagram illustrating the behavior of data cells 1 and 2 during the series of operations depicted in FIG. 5A–5C.

The operation of the data cell illustrated in FIG. 4 will now be described in relation to FIG. 5–6. FIG. 5A–5C depict circular pointer 300 at three different points in time. In FIG. 5A, the pointer is shown in the reset condition. (It should be noted that, preferably, latches 414 and 416 in data cell 0 resets to an asserted condition, while latches 414 and 416 in data cells 1–7 reset to an unasserted condition.) In FIG. 5B, one CLOCK has occurred while the SHIFT signal was asserted (the reset signal being unasserted in both FIG. 5B and 5C). In FIG. 5C, one more CLOCK has occurred while the SHIFT signal was asserted. As can be seen, the single asserted bit stored in data cell 0 in FIG. 5A shifts to data cell 1 in FIG. 5B and then to data cell 2 in FIG. 5C.

Importantly, only two of the data cells at any time present capacitive loading to the CLOCK and SHIFT signals. In FIG. 5A, only data cells 0 and 1 load the CLOCK and SHIFT signals. In FIG. 5B, only data cells 1 and 2 load the CLOCK and SHIFT signals. In FIG. 5C, only data cells 2 and 3 load the CLOCK and SHIFT signals. Thus, the only data cells that present a capacitive load to the CLOCK and SHIFT signals at any given time are the one asserted data cell and the one data cell that immediately follows the asserted data cell.

For a more detailed understanding of how this result is accomplished, reference will now be made to the timing diagram of FIG. 6. FIG. 6 depicts the relationships of signals within data cells 1 and 2 during the three time periods shown in FIG. 5A–5C, as is indicated by dashed box 600. CLOCK and SHIFT refer to the clock and shift signals supplied by an external system to the clock and shift control inputs of the circular pointer. IN1, CKQ1, NCKQ1, SEL1, GA1, OA1, SIGNAL1 and OUT1 refer to signal names within data cell 1. IN2, CKQ2, NCKQ2, SEL2, GA2, OA2, SIGNAL2 and OUT2 refer to signal names within data cell 2.

During time period A, IN1=0 but OUT1=1. Therefore, the output of OR gate 428 in data cell 1 will be asserted. Because the output of this OR gate is connected to the switching inputs of pass-AND gates 426 and 428, CLOCK and SHIFT are capacitively loaded by data cell 1. CLOCK and SHIFT are not capacitively loaded by dam cell 2 during this time period, however, because both IN2 =0 and OUT2= 0. Thus, the output of OR gate 428 in data cell 2 is not asserted. This causes the switched inputs of pass-AND gates 426 and 428 in data cell 2 to present only very small capacitive loads to the CLOCK and SHIFT signals.

During time period B, IN1 transitions to 0, but OUT 1 transitions to 1. Therefore, the output of OR gate 428 in dam cell 1 will remain asserted, causing data cell 1 to continue to load the CLOCK and SHIFT signals. In addition, IN2 transitions to 1 during this time period, causing data cell 2 also to present a load to the CLOCK and SHIFT signals.

By the end of time period C, IN1=0 and OUT1=0. Thus, data cell 1 no longer loads CLOCK and SHIFT. At the same time, IN2=0 and OUT2=1, so data cell 2 continues to load CLOCK and SHIFT.

Figure 7:
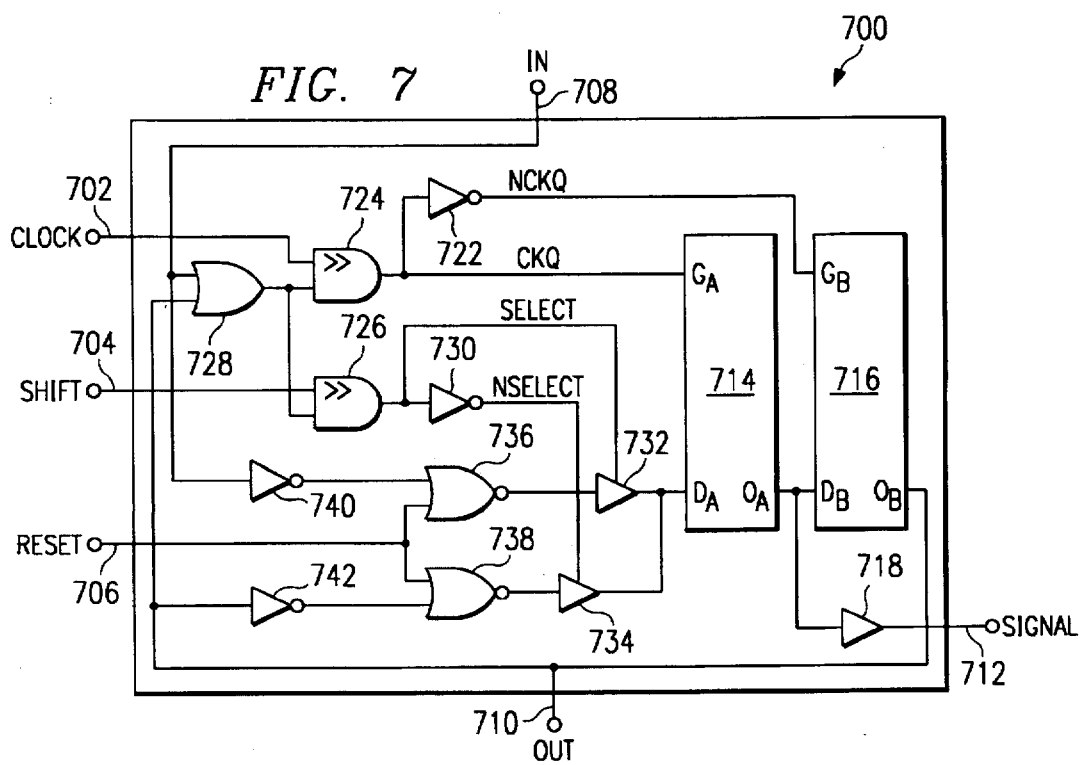
FIG. 7 is a schematic diagram illustrating a second preferred embodiment of data cells 1–7 for the shift register-based circular pointer of FIG. 3.

FIG. 7–8 illustrate another preferred implementation for data cells 0–7 of shift register 302. FIG. 7 illustrates a preferred implementation for data cells 1–7 using a synchronous reset, while FIG. 8 illustrates a preferred implementation for data cell 0 using a synchronous reset. It is intended that the implementations of FIG. 7–8 be used together to construct a preferred shift register 302. Besides the use of a synchronous reset versus an asynchronous reset, another distinction between the implementation of FIG. 4 and that of FIG. 7–8 is that, in FIG. 7–8, the CKQ signal is not gated by an AND gate 420. Instead, CKQ is supplied directly to the GA input. Also, the SELECT signal is used to control tri-stateable buffer 732, while the inverse of SELECT ("NSELECT") is used to control tri-stateable buffer 734. SELECT and NSELECT are used to determine which of signals IN 708 or OUT 710 will drive the data input DA. As can be seen from the configuration of reset 706 and the NOR gates 736 and 738, if the data cell of FIG. 7 is asserted, it will reset to 0 when RESET is asserted and a CLOCK is received.

In data cell 800 depicted in FIG. 8, OR gates 837 and 839 are used instead of NOR gates so that data cell 800 will reset to 1 when RESET is asserted and a CLOCK is received. Also, OR gate 728 and pass-AND gates 724 and 726 are not used. This is so data cell 800 will reset to 1 regardless of the state of IN808 and OUT810. Thus, if the implementation of data cell 800 is used for data cell 0 in shift register 302, data cell 0 will always present a load to the CLOCK and SHIFT signals.

If timing considerations are not critical and it is desired not only to use a synchronous reset, but also to cause data cell 0 not to present a continuous load on CLOCK and SHIFT, then the alternative embodiment shown in FIG. 9 may be used to implement data cell 0. In data cell 900, a three-input OR gate 928 is used, with RESET 906 connected to one of its inputs via line 940. In this manner, pass-AND gates 924 and 926 may be used to switch on and off the capacitance of clock input 902 and shift input 904, respectively. At the same time, however, the synchronous reset feature is provided. Because reset 906 is coupled to OR gate 928, a CLOCK will always be transmitted to GA when RESET is asserted.

While the present invention has been described in detail in relation to various preferred embodiments thereof, the described embodiments have been presented by way of example only, and not by way of limitation. It will be understood by those skilled in the art that various changes may be made in the form and details of the described embodiments, resulting in equivalent embodiments that remain within the scope of the appended claims.

What is claimed is:

1. An enhanced data cell for reducing the capacitive load presented to at least one of the control signals used to drive a shift register, said shift register of the kind having a plurality of data cells, each of said plural data cells having a data input, a data output and at least one control input, said enhanced data cell comprising:

a first pass-AND gate having a switched input and a switching input, said switching input operable to toggle the capacitive load of said switched input between two different values;

a first OR gate; and wherein said switched input of said first pass-AND gate is adapted to be coupled to a first of said control signals, said switching input of said first pass-AND gate is coupled to the output of Said first OR gate, one input of said first OR gate is coupled to said data input, another input of said first OR gate is coupled to said data output, and the output of said first pass-AND gate is coupled to a first of said at least one control inputs.

2. The enhanced data cell of claim 1, wherein said first control signal is a clock signal, and wherein said first control input is a clock input.

3. The enhanced data cell of claim 1, wherein said first control signal is a shift signal, and wherein said first control input is a shift input.

4. The enhanced data cell of claim 1, further comprising:

a second pass-AND gate having a switched input and a switching input, said switching input operable to toggle the capacitive load of said switched input between two different values;

a second OR gate; and wherein said switched input of said second pass-AND gate is adapted to be coupled to a second of said control signals, said switching input of said second pass-AND gate is coupled to the output of said second OR gate, one input of said second OR gate is coupled to said data input, another input of said second OR gate is coupled to said data output, and the output of said second pass-AND gate is coupled to a second of said at least one control inputs.

5. The enhanced data cell of claim 4, wherein said first control signal is a clock signal, said first control input is a clock input, said second control signal is a shift signal, and said second control inpfit is a shift input.

* * * * *